(12) United States Patent
Na

(10) Patent No.: US 8,810,318 B2
(45) Date of Patent: Aug. 19, 2014

(54) POWER AMPLIFIER

(75) Inventor: Jun Kyung Na, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 36 days.

(21) Appl. No.: 13/599,618

(22) Filed: Aug. 30, 2012

(65) Prior Publication Data

US 2013/0076448 A1 Mar. 28, 2013

(30) Foreign Application Priority Data

Sep. 23, 2011 (KR) .................. 10-2011-0096169

(51) Int. Cl.
*H03F 3/21* (2006.01)
(52) U.S. Cl.
USPC .......................................... 330/296; 330/285
(58) Field of Classification Search
USPC ............... 330/285, 296–298, 207 P, 367, 273
See application file for complete search history.

(56) References Cited

U.S. PATENT DOCUMENTS

| 5,081,426 | A | 1/1992 | Imanishi |
| 5,442,322 | A | 8/1995 | Kornfeld et al. |
| 5,610,540 | A | 3/1997 | Althoff et al. |
| 8,008,974 | B2 * | 8/2011 | Ha et al. ........................ 330/285 |
| 8,319,560 | B2 * | 11/2012 | Kocer et al. ................... 330/296 |
| 2003/0081436 | A1 | 5/2003 | Takahashi et al. |

FOREIGN PATENT DOCUMENTS

KR 2003-0036045 A 5/2003

OTHER PUBLICATIONS

Office Action issued in Korean Patent Application No. 10-2011-0096169 dated Jan. 17, 2013.

* cited by examiner

*Primary Examiner* — Hieu Nguyen
(74) *Attorney, Agent, or Firm* — McDermott Will & Emery LLP

(57) ABSTRACT

There is provided a power amplifier. The power amplifier includes an amplification unit including at least one amplification device; a power generation unit generating an input signal supplied to the amplification unit; and a bias circuit unit controlling bias of the at least one amplification device according to the input signal, wherein the bias circuit unit supplies a predetermined bias voltage to the amplification unit before the input signal is applied to the amplification unit. According to the embodiments of the present invention, a delay phenomenon occurring at an initial driving time or a low power mode may be significantly reduced by supplying a predetermined bias signal to an amplification unit in a standby circuit before the bias circuit unit of the power amplifier normally outputs the bias signal to the amplification unit.

7 Claims, 3 Drawing Sheets

POWER AMPLIFIER

CROSS-REFERENCE TO RELATED APPLICATIONS

This application claims the priority of Korean Patent Application No. 10-2011-0096169 filed on Sep. 23, 2011 in the Korean Intellectual Property Office, the disclosure of which is incorporated herein by reference.

BACKGROUND OF THE INVENTION

1. Field of the Invention

The present invention relates to a power amplifier capable of significantly reducing a delay phenomenon caused by applying an input signal in the case that sufficient bias voltage is not supplied to an amplification device.

2. Description of the Related Art

A power amplifier, a circuit amplifying a predetermined input signal to generate an output signal, has been widely used to amplify power in electronic devices or wireless communication device communication signals. The power amplifier may include an amplifier circuit amplifying an input signal to be amplified to generate an output signal and a bias circuit applying a bias signal for operating the amplifier circuit in a voltage or current mode.

Generally, power amplifiers are configured of a plurality of devices such as an operational amplifier, a transistor, a resistor, or the like. In particular, since a device such as the transistor has characteristics the same as those of a switching device, a delay may occur due to a switching operation in each device when a signal is transferred through a plurality of transistors. In particular, when an output from a circuit unit applying an input signal to the amplifier circuit and an output from a bias circuit unit generating a bias signal for operating the amplifier circuit are not synchronized with each other, or the bias signal that is an output from the bias circuit unit is not sufficiently rapidly generated from the time at which the input signal is generated, even in the case that the input signal is applied to the amplifier circuit, the input signal may not be amplified, since the bias signal for operating the amplifier circuit may not be applied.

For example, in the power amplifier configured by a plurality of switching devices, the bias signal output from the bias circuit is applied to a gate or a base of the transistor. However, in a case in which the bias signal applied to the gate or the base of the transistor in the bias circuit is not synchronized with the input signal, or in a pedestal period in which the bias signal is applied later than the input signal, or the like, a delay phenomenon of signal amplification occurs within the power amplifier, which may have an adverse effect on power calibration in the entire system.

SUMMARY OF THE INVENTION

An aspect of the present invention provides a power amplifier capable of solving a delay phenomenon in signal amplification by maintaining the power amplifier in a standby state by applying a predetermined voltage (or current) signal to the power amplifier while a bias signal is not applied to the power amplifier.

According to an aspect of the present invention, there is provided a power amplifier, including: an amplification unit including at least one amplification device; a power generation unit generating an input signal supplied to the amplification unit; and a bias circuit unit controlling a bias of the at least one amplification device according to the input signal, wherein the bias circuit unit supplies a predetermined bias voltage to the amplification unit before the input signal is applied to the amplification unit.

The power amplifier may further include a control circuit unit determining the input signal generated by the power generation unit.

The amplification unit may include at least one transistor as the at least one amplification device and the bias circuit unit may include a resistor supplying the predetermined bias voltage before the input signal is applied to at least one of the amplification devices.

The resistor may be connected between at least one bias terminal of the amplification devices and a voltage-supplying terminal supplying a predetermined driving voltage.

The amplification unit may include a first amplification device and a second amplification device and the bias circuit unit may include a first bias circuit part and a second bias circuit part controlling a bias of each of the first amplification device and the second amplification device.

The first bias circuit part may include a resistor for supplying a predetermined bias voltage to the first amplification device before the input signal is applied to the first amplification device.

The first bias circuit part may include at least one transistor, the resistor may be connected between a source terminal and a drain terminal of the transistor, and a predetermined voltage signal for generating the bias voltage may be applied through the source terminal of the transistor included in the first bias circuit part.

The voltage signal applied through the source terminal of the transistor included in the first bias circuit part may correspond to the signal applied to the input terminal of the power generation unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
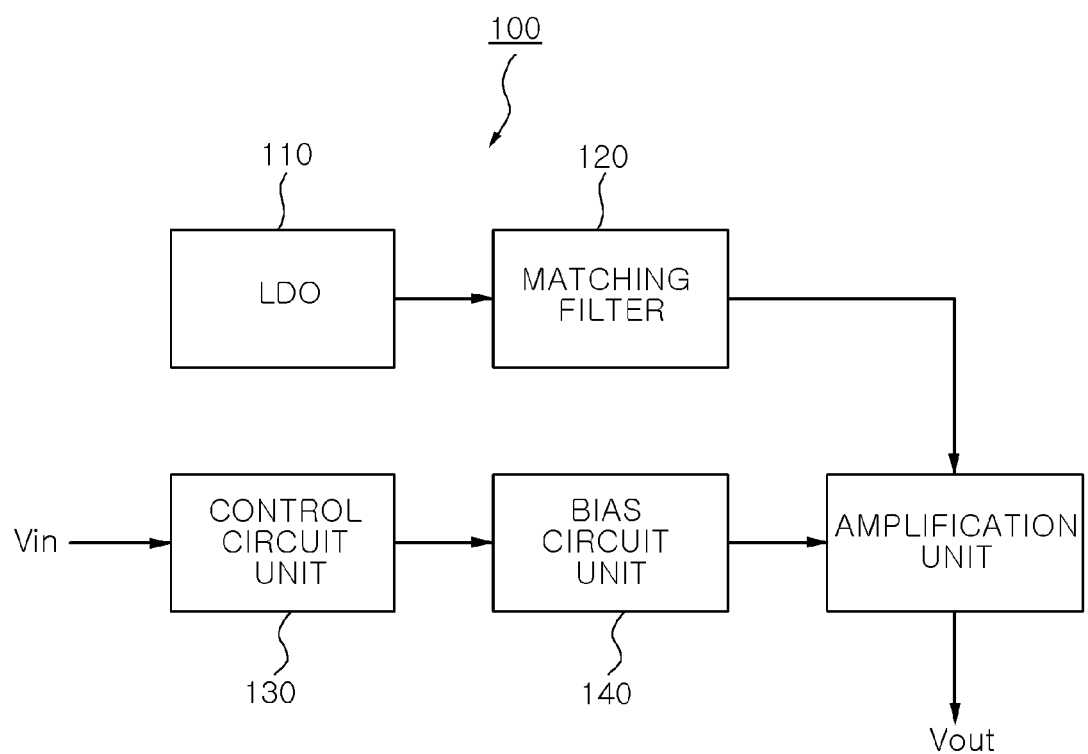
FIG. 1 is a block diagram showing a power amplifier according to an embodiment of the present invention.

Embodiments of the present invention will be described in detail with reference to the accompanying drawings. These embodiments will be described in detail for those skilled in the art in order to practice the present invention. It should be appreciated that various embodiments of the present invention are different but do not have to be exclusive. For example, specific shapes, configurations, and characteristics described in an embodiment of the present invention may be implemented in another embodiment without departing from the spirit and the scope of the present invention. In addition, it should be understood that position and arrangement of individual components in each disclosed embodiment may be changed without departing from the spirit and the scope of the present invention. Therefore, a detailed description described below should not be construed as being restrictive. In addition, the scope of the present invention is defined only by the accompanying claims and their equivalents if appropriate.

Similar reference numerals will be used to describe the same or similar functions throughout the accompanying drawing.

Hereinafter, embodiments of the present invention will be described in detail with reference to the accompanying drawings so that those skilled in the art may easily practice the present invention.

FIG. 1 is a block diagram showing a power amplifier according to an embodiment of the present invention.

Referring to FIG. 1, a power amplifier 100 according to the embodiment of the present invention may include a power generation unit (LDO) 110, a matching filter 120, a control circuit unit 130, a bias circuit unit 140, and an amplification unit 150.

The power generation unit 110 may determine voltage input to the matching filter by using voltage supplied from the outside, for example, voltage supplied from batteries for portable devices, or the like, provided that the power amplifier 100 according to the embodiment of the present invention is included in the portable devices, or the like. As described below, the power generation unit 110 may include an operational amplifier, switching devices, or the like, and an output signal from the power generation unit 110 may be input to the matching filter 120. The embodiment of the present invention assumes that the power generation unit 110 is implemented by a low dropout (LDO). Although FIG. 1 shows the above case, the embodiment of the present invention is not limited thereto. Therefore, the power generation unit 110 may also be implemented by a general voltage regulator.

The matching filter 120 may determine an input signal to be supplied to the amplification unit 150 based on the signal output from the power generation unit 110. Provided that the input signal is supplied to the amplification unit 150 in a current mode, the matching filter 120 may include a current dividing circuit dividing current output from the power generation unit 110 and determining an input signal supplied to the amplification unit 150. The matching filter 120 may be simply implemented by a plurality of resistors providing different current paths and may control an input current applied to the amplification unit 150 according to a ratio between the plurality of resistors.

Provided that the matching filter 120 includes the plurality of resistors, resistors included in the matching filter 120 may be connected to each other in parallel so as to provide different current paths, in particular, at least respective ones of both terminals of the resistors are connected to a single node. A node at which the plurality of resistors are connected to each other may be a node to which the output voltage of a power generation unit 210 is supplied. A magnitude of current distributed to respective resistors of the matching filter 120 may be determined according to a ratio between the resistors, a output voltage of the power generation unit 210, and an output current of the control circuit unit 130.

The control circuit unit 130 may include the operational amplifier, the switching devices, and the resistors and receive predetermined input voltage to determine voltage applied to an input terminal of the amplification unit 150. For example, the control circuit unit 130 may be implemented by a voltage follower circuit using an operational amplifier, wherein the switching device such as a transistor may be connected to an output terminal of the voltage follower circuit. The voltage follower may generate an input voltage and a predetermined output current determined according to a resistor connected to a load terminal, and may configure a circuit determining a voltage to be applied to the input terminal of the amplification unit 150 according to the output current of the voltage follower. The configuration described above will be described below with reference to FIG. 2.

The bias circuit unit 140 may be a circuit applying a predetermined bias signal to at least one switching device included in the amplification unit 150. For example, the magnitude of the bias signal transferred from the bias circuit unit 140 to the amplification unit 150 may be determined according to an output current of the control circuit unit 130 and a voltage applied to the input terminal of the amplification unit 150. The bias circuit unit 140 may include an operational amplifier, switching devices, resistors, and the like. In particular, inversion and non-inversion input terminals of the operational amplifier included in the bias circuit unit 140 may be respectively connected to the output terminal of the control circuit unit 130 and the input terminal of the amplification unit 150 to generate a bias signal so that the output current of the control circuit unit 130 may be identical to a voltage of the input terminal of the amplification unit 150.

As can be appreciated from the connection relation of respective components 110 to 150 shown in FIG. 1, the bias circuit unit 140 may determine a bias signal to be supplied to the amplification unit 150 according to an output voltage or an output current output from the control circuit unit 130. Therefore, even in a case in which the entire power amplifier 100 starts an operation up to a time that the control circuit unit 130 generates an output signal from an input voltage Vin and a bias signal is generated from the output signal, a sufficient bias signal may not be applied to the amplification unit 150. Therefore, even though a driving voltage is generated from the power generation unit 110 and the input voltage Vin is normally applied to the control circuit unit 130, the bias circuit unit 140 does not yet generate the bias signal and thus, a delay phenomenon that the amplification unit 150 cannot be operated occurs.

The delay phenomenon may easily occur at the early stage of driving of the power amplifier 100 or in a pedestal period in which the bias circuit is operated later. In particular, the delay phenomenon may be seriously shown when the power amplifier 100 is operated in a low power mode. Consequently, the delay phenomenon appearing in the power amplifier 100 has an adverse effect on power calibration. Therefore, the delay time occurring in the amplification unit 150 needs to be significantly reduced by controlling a bias signal in the low power mode or the pedestal period.

As described above, the delay phenomenon may occur since the bias signal by the driving or input voltage applied to the power generation unit 210 and the control circuit unit 230 is not sufficiently rapidly generated. Therefore, a separate or additional circuit generating a bias signal may be provided in a period in which the bias signal cannot be applied to the amplification unit 150 by an operation of the bias circuit unit 140, thereby mitigating the delay phenomenon.

In the embodiment of the present invention, a separate standby circuit for generating a bias signal for a time when the bias signal necessary for the amplification unit 150 is not generated by the bias circuit unit 140 may be implemented within the bias circuit unit 140. Although described below with reference to FIG. 2, the standby circuit may be simply implemented by a resistor connected between a source and a drain (or an emitter and a collector) of the switching device (transistor) and a predetermined voltage applied to the source terminal. In this case, a terminal not connected to the source terminal among both terminals of the resistor may be connected to the gate (or base) of the switching device included in the amplification unit 150 so that the voltage dropped by the resistor may be applied to the gate (or base) of the switching device (transistor) included in the amplification unit 150.

In this case, the voltage supplied to the source terminal of the switching device included in the standby circuit within the bias circuit unit 140 may be the input voltage applied to the power generation unit 110 or the control circuit unit 130 or a voltage signal synchronized therewith. The delay phenomenon appearing in the output signal of the amplification unit 150 may be significantly reduced and the bias signal may be stably applied, by synchronizing the input of the power generation unit 110 or the control circuit unit 130 controlling the driving signal of the power amplifier 100 and the current signal input to the amplification unit 150 with the voltage signal operating the standby circuit or applying the same voltage signal to two signals.

Figure 2:
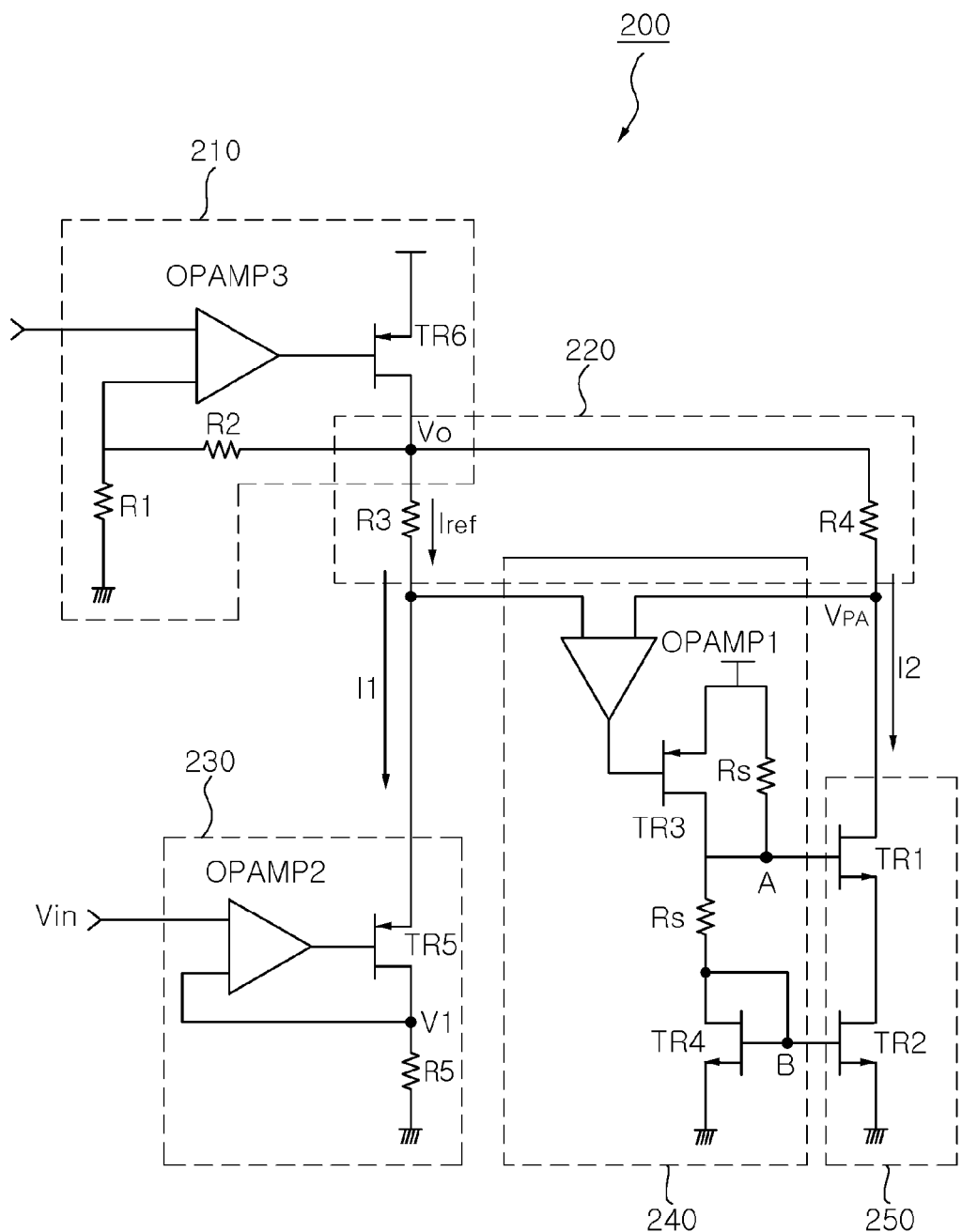
FIG. 2 is a circuit diagram showing the power amplifier according to the embodiment of the present invention.

FIG. 2 is a circuit diagram showing the power amplifier according to the embodiment of the present invention. Referring to FIG. 2, the power amplifier 200 according to the embodiment of the present invention may include the power generation unit 210, a matching filter 220, a control circuit unit 230, a bias circuit unit 240, and an amplification unit 250. Although FIG. 2 shows the detailed circuit of each component included in the power amplifier 200, this is only an example for achieving the technical subject in the present invention. Therefore, it is to be noted that the scope of the present invention is not limited to the circuit type shown in FIG. 2.

In addition, referring to FIG. 2, transistors TR1 and TR2 included in the amplification unit 250 and a transistor TR4 included in the bias circuit unit 240 are shown as an N-channel MOSFET (N-MOSFET), and transistors TR5 and TR6 respectively included in the power generation unit 210 and the control circuit unit 230 and another transistor TR3 of the bias circuit unit 240 are shown as a P-channel MOSFET (P-MOSFET). However, this is only one of the implementation examples of the power amplifier 200 according to the embodiment of the present invention. Therefore, it is to be noted that the type of the transistors TR1 to TR6 is not necessarily limited thereto.

Referring to FIG. 2, the power generation unit 210 may be implemented by a voltage regulator circuit such as low drop output (LDO) and may include the transistor TR6 that is the switching device, and an operational amplifier OP-AMP3. Any one of the input terminals of the operational amplifier OP-AMP3 may have a voltage Vd applied thereto for generating the driving voltage of the power amplifier 200, and an output terminal of the operational amplifier OP-AMP3 may be connected to a gate of the transistor TR6. An output voltage Vo of the power generation unit 210 corresponding to a drain voltage of the transistor TR6 may be represented by the following Equation 1.

$$V_0 = \left(1 + \frac{R_2}{R_1}\right)V_d \quad \text{[Equation 1]}$$

That is, the voltage Vd applied to the input terminal of the power generation unit 210 and a voltage determined by resistors $R_1$ and $R_2$ may be output through the output terminal of the power generation unit 210.

The control circuit unit 230 connected to the output terminal of the power generation unit 210 through a resistor $R_3$ may be implemented by an operational amplifier OP-AMP2 and the transistor TR5 similarly to that of the power generation unit 210. However, a circuit may be implemented so that the drain of the transistor TR5 is directly connected to any one of the input terminals of the operational amplifier OP-AMP2 to enable the drain voltage $V_1$ of the transistor TR5 to be equal to the input voltage $V_{in}$ of the block of the control circuit unit 230. In conclusion, the current flowing in the drain of the transistor TR2 may be determined by the drain voltage $V_1$ and the resistor $R_5$, and the current $I_1$ introduced from the source terminal of the TR2 may be equal to the current flowing in the drain in characteristics of the transistor, so that the $I_1$ may be also determined by the drain voltage $V_1$ and the resistor $R_5$.

The operational amplifier OP-AMP1 and the transistors TR3 and TR4 included in the bias circuit unit 240 may generate a bias signal to be applied to the transistors TR1 and TR2 included in the amplification unit 250. In this case, the voltage applied to bias terminals A and B of the amplification unit 250 may be determined so that the voltages of the input terminal of the operational amplifier OP-AMP1 are equal to each other, and the current $I_2$ applied to the amplification unit 250 may be determined according to a ratio of resistors $R_3$ and $R_4$ included in the matching filter 220. In particular, the bias circuit unit 240 may include as the standby circuit the resistor Rs connected between the source and drain of the transistor TR3 so as to reduce a delay time of the signal.

The resistors $R_3$ and $R_4$ included in the matching filter 220 may be connected to a node (Vo of FIG. 2) at which at least respective ones of both terminals of the resistors $R_3$ and $R_4$ are connected to a single node, Vo, as described with reference to FIG. 1. The terminals that are not connected to the same node may be also respectively connected to the input terminals of the operational amplifier OP-AMP1 of the bias circuit unit 240 and thus, may be considered as having the same voltage in the characteristics of the operational amplifier OP-AMP1 having a very large input resistance (ideally, infinite). Consequently, the resistors $R_3$ and $R_4$ may have a structure in which they are connected to each other in parallel, and the ratio of current $I_1$ and $I_2$ flowing respective resistors may be determined according to the ratio of $R_3$ and $R_4$. As the embodiment of the present invention, the current $I_1$ is the same as the current flowing in the drain of the transistor TR5 connected to the output terminal of the control circuit unit 230 and thus, the current $I_2$ may be determined according to the current $I_1$, such that voltage $V_{P4}$ of the input terminal of the amplification unit 250 may be determined.

When the current $I_2$ applied to the amplification unit 250 is determined by the ratio of the resistors $R_3$ and $R_4$, the amplification signal needs to be generated by the transistors TR1 and TR2. However, as shown in FIG. 2, the operation of the transistors TR1 and TR2 is controlled by the bias signal applied to each gate, and the bias signal is each generated by the transistors TR3 and TR4 included in the bias circuit unit 240. As a result, since the transistor TR1 of the amplification unit 250 is in a turned-off state even for a very short time before the bias signal applied from the drain terminal of the TR3 to the node A is generated by operating the transistor TR3 of which the gate is connected to the output terminal of the operational amplifier OP-AMP1, the signal may not be amplified even in a case in which the input current $I_2$ is applied.

That is, even though the driving voltage Vd and the input voltage $V_{in}$ are applied to the power generation unit 210 and the control circuit unit 230 and the circuit starts to operate, when the bias circuit unit 240 is not operated and thus, the sufficient bias signal is not applied to the amplification unit 250, the delay may occur between the input and output signals of the amplification unit 250. Even though the time is a very short time such as several μs, this may cause the adverse effect on the operation of the circuit, in particular, bring about a defect at the time of the low power operation in view of the power calibration.

In order to solve the above-mentioned defects, in the embodiment of the present invention, the bias signal may be immediately generated while applying the driving voltage Vd and the input voltage $V_{in}$ to the power generation unit 210 and the control circuit unit 230 by connecting the resistor Rs between the source terminal and the drain terminal (node A) of the transistor TR3 of which the gate is connected to the output terminal of the operational amplifier OP-AMP1 of the bias circuit unit 240. That is, the predetermined voltage applied through one end of the resistor Rs, for example, the source terminal of the transistor TR3 may drop through the resistor Rs and thus, the dropped voltage may be applied to the transistors TR1 and TR2 through the nodes A and B as the bias signal, thereby preventing the delay occurring in the amplification unit 250. Hereinafter, this will be described with reference to FIG. 3.

Figure 3:
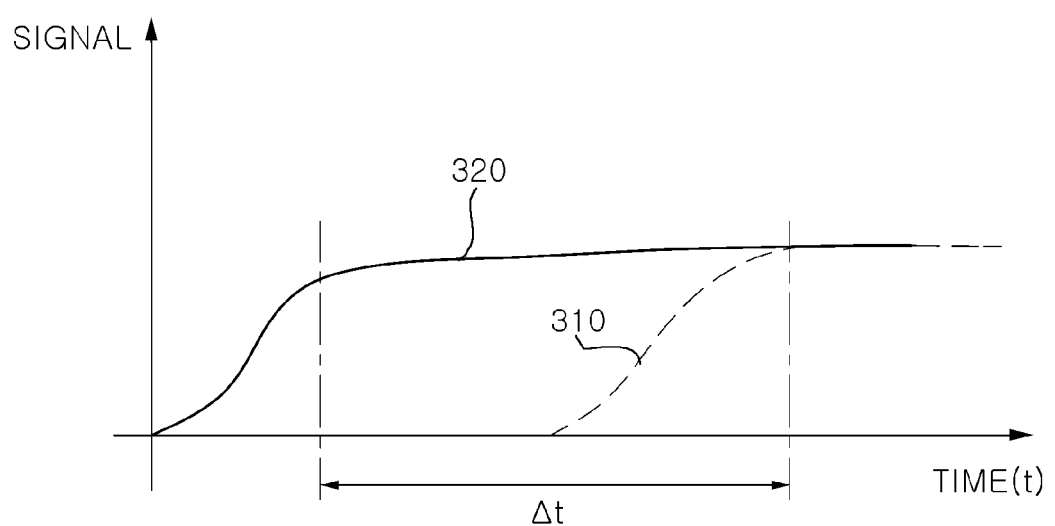
FIG. 3 is a timing graph showing a delay improvement effect according to the power amplifier according to the embodiment of the present invention.

FIG. 3 is a timing graph showing a delay improvement effect according to the power amplifier according to the embodiment of the present invention. Referring to FIG. 3, according to the embodiment of the present invention, it can be appreciated that a response speed for the input voltage appears earlier by $^\Delta t$, comparing a waveform 320 in a case in which the standby circuit is included in the bias circuit unit 240 with a waveform 310 in a case in which the standby circuit is not included in the bias circuit unit 240. Actually, according to simulation results, the resistor Rs is connected to the transistor TR3 of the bias circuit unit 240 and the standby circuit is implemented using a predetermined voltage applied to the source terminal of the transistor TR3, such that the response speed improvement effect of about 9 μs may be obtained.

When the bias circuit unit does not include the standby circuit as in the embodiment of the present invention, the output signal of the amplification unit 250 may not have a sufficiently fast response speed even when the input voltage is applied. This may lead to the degradation in the entire circuit performance efficiency and the degradation in the power calibration performance and the current applied at the early stage of the driving is not used for the normal operation of the power amplifier 200 and thus, the current consumption may be unnecessarily increased.

In the case of the related art in which there is no standby circuit including the resistor Rs in the circuit shown in FIG. 2, the operation of the bias circuit unit 240 will be described in detail below. The driving voltage applied to the power amplifier 200 is applied to any one of the source of the transistor TR6 and the input terminal of the operational amplifier OP-AMP2 and the source of the transistor TR3. Therefore, the bias voltage of the amplification unit 250 may not be output through the nodes A and B in the bias circuit unit 240 at the time before the bias voltage is applied to the gate of the transistor TR3 by operating the operational amplifier OP-AMP1 in the bias circuit unit 240, and thus, the delay may occur.

However, according to the embodiment of the present invention, when the resistor Rs is disposed between the source terminal and the drain terminal of the transistor TR3 of the bias circuit unit 240 and the driving voltage is applied through the source terminal connected to one end of the Rs, a predetermined bias voltage may be applied to the node A (the gate terminal of the transistor TR1) through the Rs while the driving voltage is applied. In addition, since the bias voltage may be applied to the transistor TR2 through the resistor Rs connected between the node A and the node B, the delay time occurring when the operational amplifier 200 starts to operate may be reduced. As described above, in order to prevent the operation delay of the amplification unit 250, a voltage applied to the source terminal of the transistor TR3 connected to the resistor Rs may correspond to or synchronize with the input voltage of the power generation unit 210 or the control circuit 230.

As set forth above, according to the embodiment of the present invention, the power amplifier may be capable of solving the delay phenomenon of signal amplification and in particular, being stably operated in the low power period, by maintaining the power amplifier in the standby state by applying a predetermined voltage (or current) signal to the power amplifier when a bias signal is not applied to the amplification device. According to the embodiment of the present invention, the adverse effect on the power calibration in the entire system may be significantly reduced by reducing the pedestal period in which the bias circuit is operated later.

Respective functional blocks described above may be implemented by well-known various devices of an electronic circuit, an integrated circuit, an application specific integrated circuit (ASIC), or the like. These devices may be implemented separately from each other or two or more thereof may be integrated in the implementation thereof. The units or devices described above and in claims, as shown as being separate from each other by a simply functional aspect, may be implemented by a physically integrated one unit or device. Elements described as being single above may be implemented by a combined element between several elements. In addition, respective operations in the method described according to the embodiments of the present invention may be modified in the sequence thereof and other operations may be added without being deviated from the spirit of the present invention.

While the present invention has been shown and described in connection with the embodiments, it will be apparent to those skilled in the art that modifications and variations can be made without departing from the spirit and scope of the invention as defined by the appended claims.

What is claimed is:

1. A power amplifier, comprising:
   an amplification unit including at least one amplification device;
   a power generation unit generating an input signal supplied to the amplification unit; and
   a bias circuit unit controlling a bias of the at least one amplification device according to the input signal,
   wherein the amplification unit includes a first amplification device and a second amplification device, and
   the bias circuit unit includes a first bias circuit part and a second bias circuit part controlling a bias of each of the first amplification device and the second amplification device,
   wherein the first bias circuit part includes a resistor supplying a predetermined bias voltage to the first amplification device before the input signal is applied to the first amplification device.

2. The power amplifier of claim 1, further comprising a control circuit unit determining the input signal generated by the power generation unit.

3. The power amplifier of claim 1, wherein the amplification unit includes
   at least one transistor as the at least one amplification device, and the bias circuit unit includes a resistor supplying the predetermined bias voltage before the input signal is applied to at least one of the amplification devices.

4. The power amplifier of claim 3, wherein the resistor is connected between at least one bias terminal of the amplification devices and a voltage-supplying terminal supplying a predetermined driving voltage.

5. The power amplifier of claim 4, wherein the driving voltage supplied through the voltage-supplying terminal corresponds to a voltage applied to an input terminal of the power generation unit.

6. The power amplifier of claim 1, wherein the first bias circuit part includes at least one transistor and the resistor is connected between a source terminal and a drain terminal of the transistor, and
   a predetermined voltage signal generating the bias voltage is applied through the source terminal of the transistor included in the first bias circuit part.

7. The power amplifier of claim 6, wherein the voltage signal applied through the source terminal of the transistor included in the first bias circuit part corresponds to the signal applied to the input terminal of the power generation unit.

* * * * *